(12) United States Patent
Lowrey et al.

(10) Patent No.: US 8,036,013 B2
(45) Date of Patent: *Oct. 11, 2011

(54) USING HIGHER CURRENT TO READ A TRIGGERED PHASE CHANGE MEMORY

(75) Inventors: Tyler Lowrey, West Augusta, VA (US); Ward D. Parkinson, Boise, ID (US); George A. Gordon, San Jose, CA (US)

(73) Assignee: Ovonyx, Inc., Troy, MI (US)

( * ) Notice: Subject to any disclaimer, the term of this patent is extended or adjusted under 35 U.S.C. 154(b) by 1314 days.

This patent is subject to a terminal disclaimer.

(21) Appl. No.: 11/093,864

(22) Filed: Mar. 30, 2005

(65) Prior Publication Data

US 2006/0227591 A1    Oct. 12, 2006

(51) Int. Cl.
*G11C 11/00* (2006.01)
(52) U.S. Cl. ........................................ 365/148
(58) Field of Classification Search ............... 365/148, 365/113
See application file for complete search history.

(56) References Cited

U.S. PATENT DOCUMENTS

| | | | | |
|---|---|---|---|---|
| 6,452,831 B2 * | 9/2002 | Ahn et al. | | 365/148 |
| 6,462,984 B1 * | 10/2002 | Xu et al. | | 365/175 |
| 6,982,913 B2 * | 1/2006 | Oh et al. | | 365/203 |
| 2005/0185445 A1 * | 8/2005 | Osada et al. | | 365/148 |
| 2006/0002172 A1 * | 1/2006 | Venkataraman et al. | | 365/148 |
| 2006/0091492 A1 * | 5/2006 | Lee et al. | | 257/467 |
| 2006/0146600 A1 * | 7/2006 | Johnson | | 365/163 |

OTHER PUBLICATIONS

U.S. Appl. No. 11/093,877, filed Mar. 30, 2005, Tyler Lowrey et al., *Using a Bit Specific Reference Level to Read a Memory*.
U.S. Appl. No. 11/093,878, filed Mar. 30, 2005, Ward D. Parkinson et al., *Reading Phase Change Memories*.
U.S. Appl. No. 11/093,709, filed Mar. 30, 2005, Ferdinando Bedeschi et al., *Detecting Switching of Access Elements of Phase Change Memory Cells*.
U.S. Appl. No. 11/093,879, filed Mar. 30, 2005, Ferdinando Bedeschi et al., *Circuit for Reading Memory Cells*.

* cited by examiner

*Primary Examiner* — Hoai Ho
*Assistant Examiner* — Anthan T Tran
(74) *Attorney, Agent, or Firm* — Trop, Pruner & Hu, P.C.

(57) ABSTRACT

A phase change memory cell may be read by driving a current through the cell higher than its threshold current. A voltage derived from the selected column may be utilized to read a selected bit of a phase change memory. The read window or margin may be improved in some embodiments. A refresh cycle may be included at periodic intervals.

26 Claims, 6 Drawing Sheets

USING HIGHER CURRENT TO READ A TRIGGERED PHASE CHANGE MEMORY

BACKGROUND

This invention relates generally to semiconductor memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that state is retained until reprogrammed, even if power is removed. This is because the programmed resistance represents a phase or physical state of the material (e.g., crystalline or amorphous).

Conventionally, phase change memories are read without triggering the memory element. Triggering occurs when the threshold current (at threshold voltage) of the memory element is exceeded. As a result, the read current may be limited to avoid triggering. But limiting the read current to less than the threshold current reduces performance. Use of a higher current but limiting the voltage applied to less than the threshold voltage is sensitive to variation in threshold voltage and the voltage clamp which may reduce margin and inadvertently trigger the memory element, possibly causing the cell to change (read disturb) or be misread (non-repeating "soft error").

Thus, it would be desirable to improve the margin of reading phase change memories.

DETAILED DESCRIPTION

Figure 1:
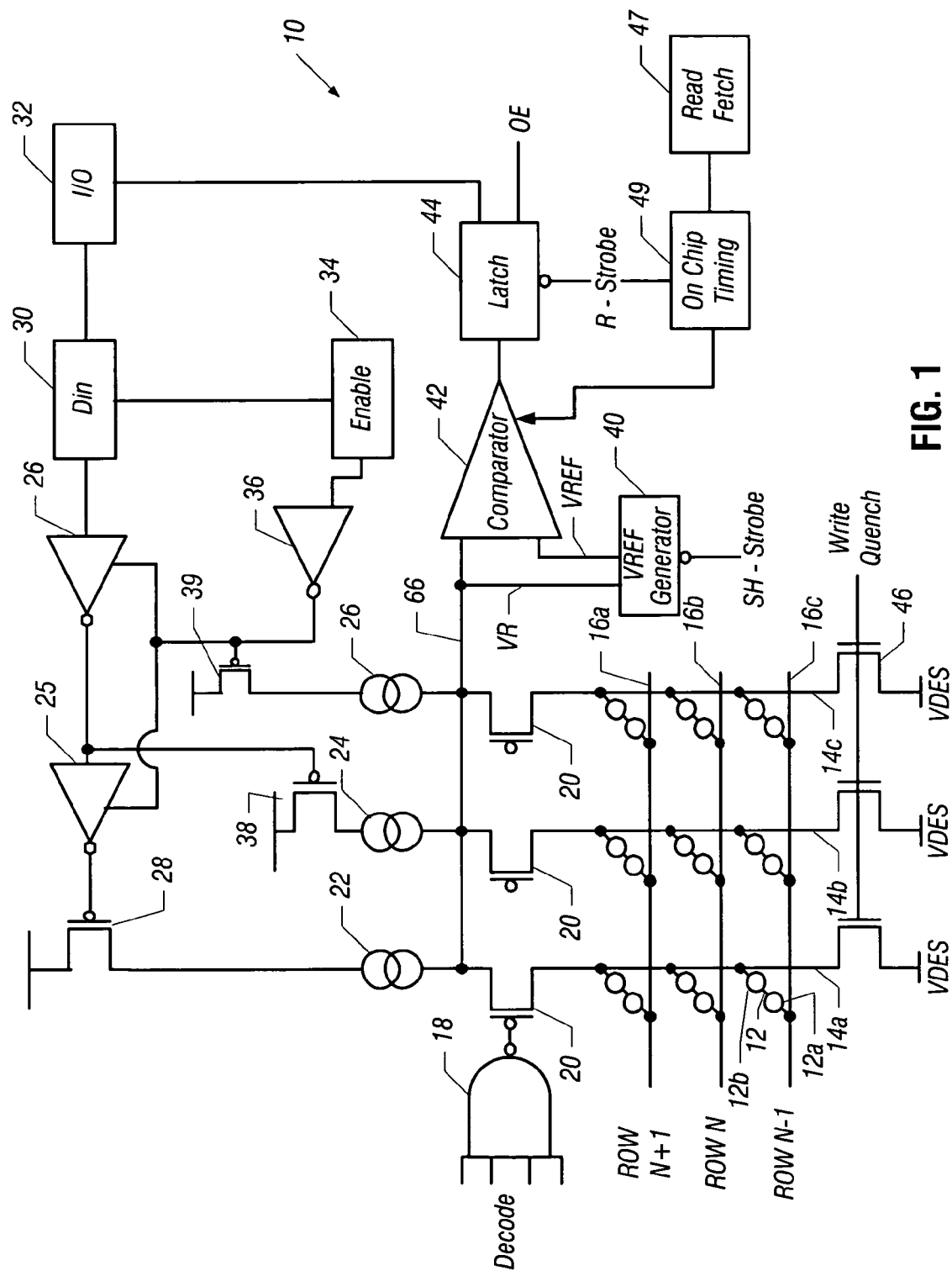
FIG. 1 is a circuit diagram for one embodiment of the present invention.

Referring to FIG. 1, a memory 10 may include an array of memory cells 12 arranged in rows 16 and columns 14 in accordance with one embodiment of the present invention. While a relatively small array is illustrated, the present invention is in no way limited to any particular size of an array. While the terms "rows" and "columns" are used herein, they are merely meant to be illustrative and are not limiting with respect to the type and style of the sensed array.

The cell 12 may be any memory cell including a phase change memory cell. Examples of phase change memory cells include those using a chalcogenide memory element 12b and threshold device 12a, having IV characteristic curves like those in FIGS. 2A and 2B. A select or threshold device may be an ovonic threshold switch that can be made of a chalcogenide alloy that does not exhibit an amorphous to crystalline phase change and which undergoes rapid, electric field initiated change in conductivity that persists so long as a holding current is present.

In the case illustrated, a cell 12 includes an access, select, or threshold device 12a, as well as a memory sensing device 12b which stores a bit of data. A set of transistors 46 may be located on the columns 14 in order to enable write quenching (fast trailing edge of reset write pulse), deselecting, and precharging to a voltage, which may be different than the deselect VDES by muxing to a different voltage other than, for example, VDES of FIG. 1.

A column decoder 18 receives address signals to select the desired column using transistors 20 associated with each column. A reset write current source 22, a set write current source 24, and a read current source 26 are coupled at a common node, 66, at their outputs to supply current to the selected column 14, such as column 14b, as determined by which column transistor 20 is on, such as column 20b. Of course, the current sources in actual practice would be coupled to selected columns as needed in response to commands from an external memory user such as a processor, at the address provided by the external user.

In one embodiment, the phase change material used in the sensing device 12b may be suitable for non-volatile memory data storage. The phase change material may be a material having electrical properties (e.g., resistance) that may be changed through the application of energy such as, for example, heat, light, voltage potential, or electrical current.

Examples of phase change materials may include a chalcogenide material. A chalcogenide material may be a material that includes at least one element from column VI of the periodic table or may be a material that includes one or more of the chalcogen elements, e.g., any of the elements of tellurium, sulfur, or selenium. Chalcogenide materials may be non-volatile memory materials that may be used to store information that is retained even after electrical power is removed.

In one embodiment, the phase change material may be chalcogenide element composition from the class of tellurium-germanium-antimony ($Te_xGe_ySb_z$) material or a GeSbTe alloy, such as type 2,2,5 although the scope of the present invention is not limited to just these materials.

In one embodiment, if the memory material is a non-volatile, phase change material, the memory material 12b may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state.

Programming of the memory material to alter the state or phase of the material may be accomplished by selecting the cell through applying a relatively low voltage, such as zero volts to the line 16 and a current into the selected column 14 from current sources 22 (to reset to higher resistance) or 24 (a lower current or slower trailing edge to reset to lower resistance), thereby generating a voltage potential across the memory material. An electrical current may flow through a portion of the memory material in response to the applied voltage potentials, and may result in heating of the memory material.

This controlled heating and subsequent controlled cooling may alter the memory state or phase of the memory material. Altering the phase or state of the memory material may alter an electrical characteristic of the memory material. For example, resistance of the material may be altered by altering the phase of the memory material. Either all or a portion of the phase change memory material may be altered during the writing pulse (i.e. only a portion/region of sensing device 12b adjacent to either the top or bottom electrode may be phase changed during the write operation). In one embodiment, primarily the portion of memory material that undergoes phase change is the region that is adjacent to the smaller electrode contacting the sensing device 12b. The memory material may also be referred to as a programmable resistive material or simply a programmable resistance material or memory (of the cell).

In one embodiment, a voltage pulse with a potential difference of about 1.5 volts may be applied across a portion of the memory material by applying about 0 volts to a line 16 and a current of about 2 ma from write current source 22 into the selected line 14. Here, for example the voltage on the selected line 14 is positive relative to the selected line 16, but the cell or voltages may also be reversed. A current flowing through the memory material in response to the applied voltage potentials may result in heating of the memory material. This heating and subsequent controlled cooling determined by the write current pulse trailing edge rate may alter the memory state or phase of the material after it is cooled, from high resistance to low resistance, or low resistance to high resistance, or simply to rewrite the existing state to reinforce it.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state, as shown in 2B. The association of reset and set with amorphous and crystalline states, respectively, is a convention. Other conventions may be adopted.

Figure 6:
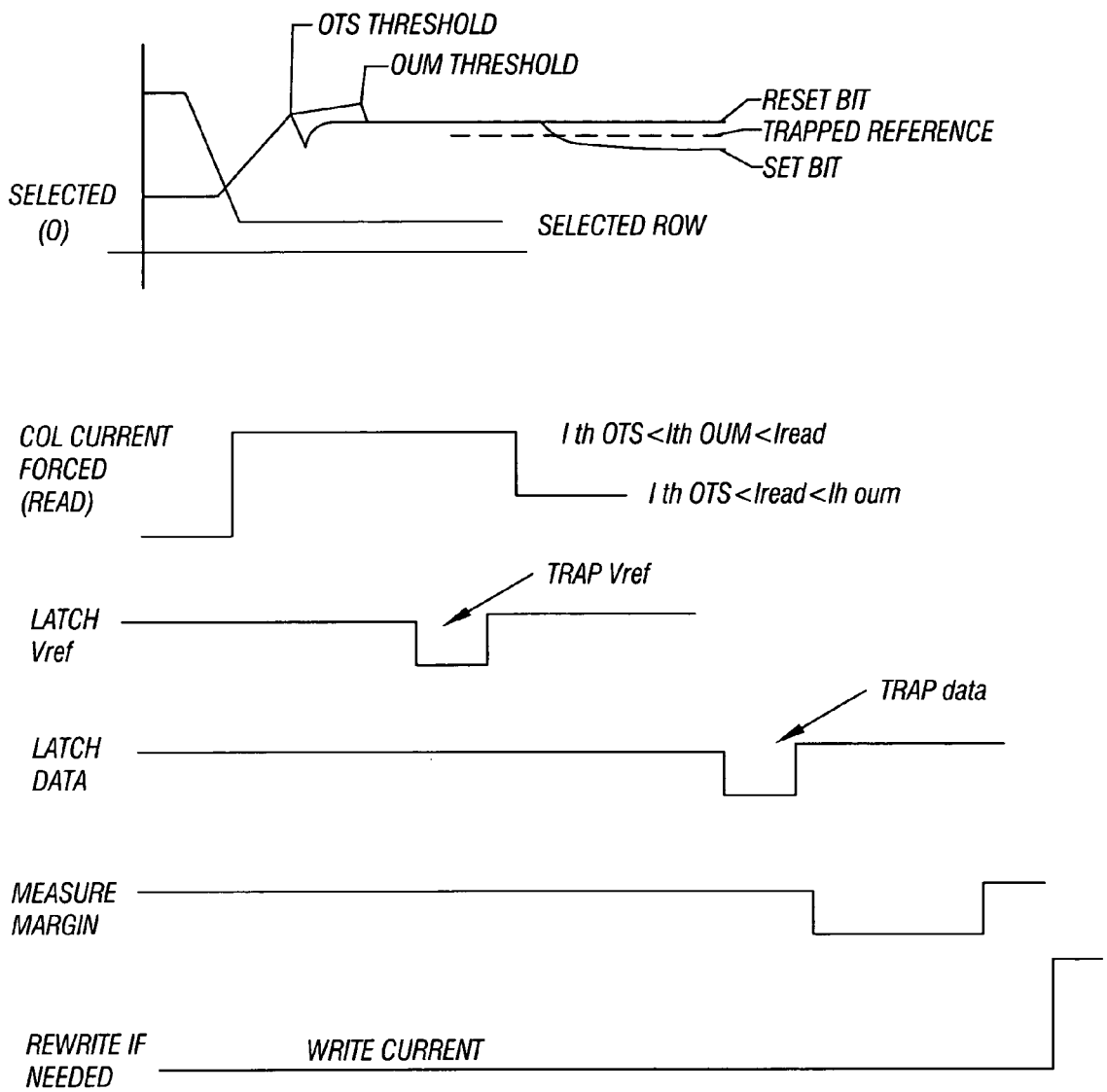
FIG. 6 is a timing diagram for another embodiment of the present invention.

Due to electrical current, the memory material may be heated to a relatively higher temperature and then subsequently cooled at a fast rate (for example, less than 10 nsec edge decay of voltage on column in terminating the write current) to amorphisize memory material and "reset" memory material. Heating the volume or memory material to a relatively lower crystallization temperature using reduced current, or reducing the temperature slowly (edge rate greater than 100 nsec) may crystallize and "set" the memory material to a lower resistance state. Various resistances of memory material may be achieved to store information by varying the amount of current flow and duration through the volume of memory material, or by tailoring the edge rate of the trailing edge of the programming current or voltage pulse (that may control the cooling rate of the selected memory element). These techniques may use feedback, as shown in FIG. 6, by reading the cell and then rewriting it to adjust, thus tailoring the memory cell more precisely to a desired resistance, and thus allowing storing and sensing more than 2 levels in the cell, for more efficient data or analog storage.

The information stored in memory material may be read by measuring the impedance of the memory material. As an example, a read current may be provided to the memory material using the selected row and column and a resulting read voltage across the memory material may be compared against a reference voltage using, for example, the sense amplifier 42 in FIG. 1. The resulting read voltage on the column may be proportional to the resistance exhibited by the selected memory storage device 12b when a read current is forced into the column.

Figure 2A:
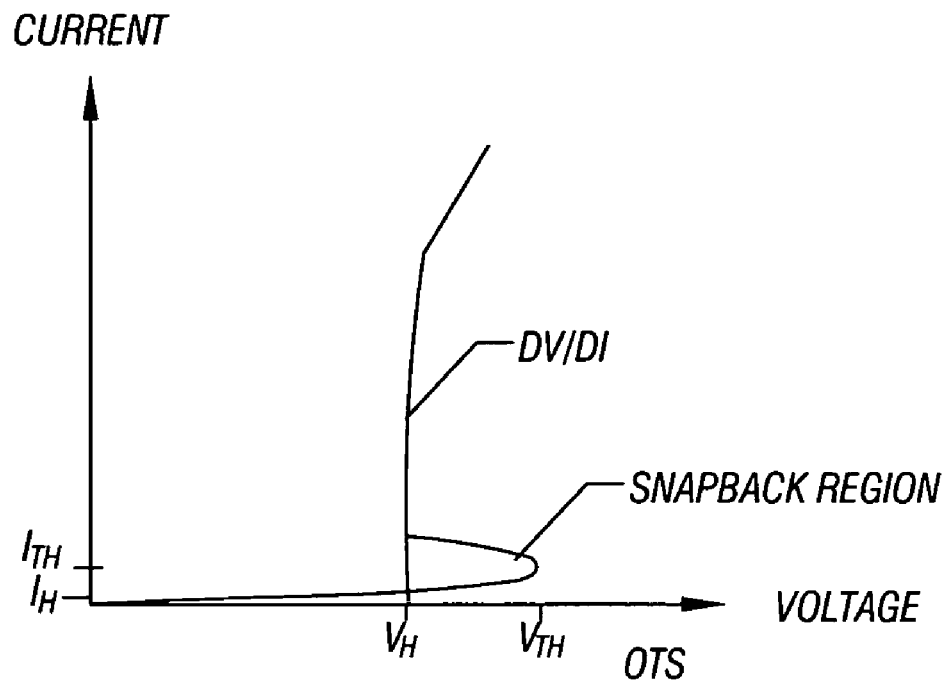
FIG. 2A is a hypothetical, representative current-voltage curve for a threshold device.

In a low voltage or low field regime in FIG. 2A, the cell select device 12a is off and may exhibit very high resistance in some embodiments. The off resistance can, for example, range from greater than 50,000 ohms to be greater than 10 gigaohms at a bias of about half the threshold voltage. The device 12a may remain in its off state until a voltage across it exceeding a threshold voltage ($V_{TH}$) or until a current exceeding a threshold current ($I_{TH}$) switches the device 12a to a highly conductive, lower dynamic resistance "on" state, called dV/dI region that, when extrapolated, will intercept the X axis at the holding voltage, $V_H$(ots), as indicated in FIG. 2A.

After turn-on, the voltage across the device 12a drops to a lower voltage, called the holding voltage $V_H$, and remains very close to this holding voltage almost regardless of the column current since the dynamic on resistance is relatively low, frequently less than 1000 ohms (in series with the holding voltage, $V_H$(ots)). In one embodiment of the present invention, as an example, the threshold voltage may be on the order of 3.1 volts and the holding voltage may be on the order of 2.9 volts. This relatively high holding voltage that is near the threshold voltage may be achieved by using three OTS devices in series as select device 12a, each with a threshold voltage of 1V and about equal to its holding voltage. Alternately, a high $V_{TH}$(ots) device, lower leakage select ots device may be in series with a lower $V_{TH}$(ots) device having higher leakage. The combined device may have a reduced difference between $V_{TH}$ and $V_H$ to better assure that the snapback does not force excessive current (Isafe) through the oum device that will increase its resistance during read.

After passing through the snapback region, in the on state, the device 12a voltage drop remains close to the holding voltage as the current passing through the device is increased, even if at a relatively high, write or read current level. Above a relatively very high current level (density) the device remains on but displays a finite and increasing dynamic resistance, with the voltage drop across 12a increasing more rapidly with increasing current due to the IR drop across the increasing dynamic resistance, as shown in the upper portion of FIG. 2A.

The device 12a may remain on until the current through the device 12a is reduced below a characteristic holding current value that is dependent on the type and area of the material, and may be changed by the top and bottom electrodes utilized to form the device 12a as well as the magnitude of capacitance on the column line (size of the array). Endurance may be improved, in some embodiments, through use of carbon electrodes and, preferably, not titanium or metals which react with select device alloy.

In some embodiments of the present invention, the threshold device 12a does not change phase. It remains permanently amorphous and its current-voltage characteristics may remain the same throughout its operating life.

As an example, for a 0.5 micrometer diameter device 12a with an approximately 750 Angstrom thickness formed of TeAsGeSSe having respective atomic percents of 16/13/15/1/55, the holding current may be on the order of 0.1 to 1 micro-amps (uA) in one embodiment. Below this holding current, the device 12a turns off and returns to the high resistance regime at low voltage, low field L in FIG. 2. The threshold current for the device 12a may generally be of the same order as the holding current, and preferably greater to reduce oscillation if driven by a high impedance current source.

The holding current may be altered by changing process variables, such as the top and bottom electrode material and the chalcogenide material. The device 12a may provide high "on current" for a given area of device compared to conventional access devices such as metal oxide semiconductor field effect transistors or bipolar junction transistors or semiconductor diodes. However, such other select devices may also be used with the embodiments described herein, particularly those requiring simplified processing such as embedded applications where the memory is a relatlively small portion of the total chip area.

Figure 2B:
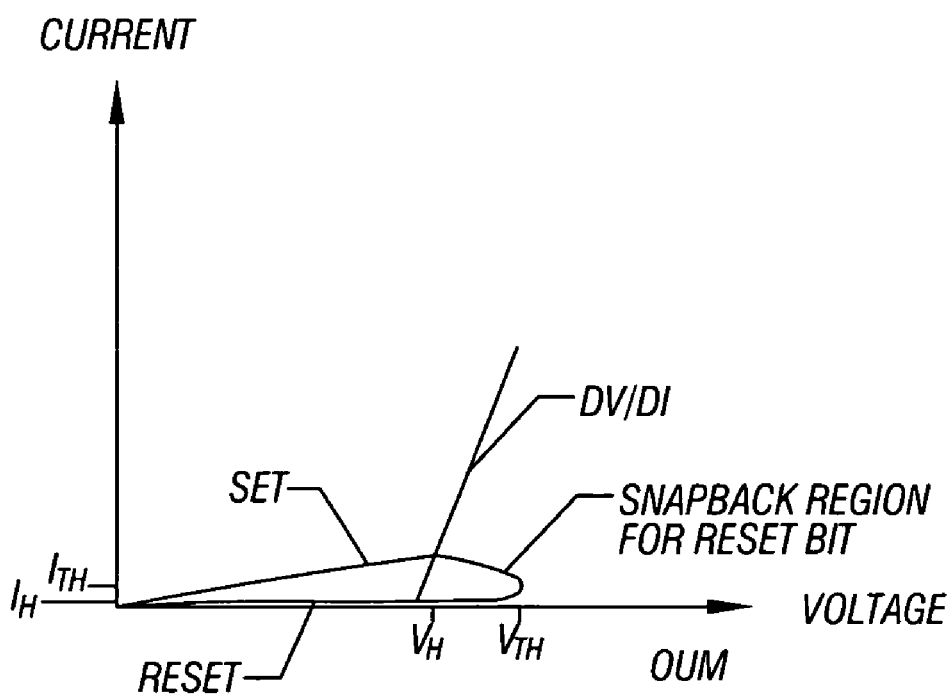
FIG. 2B is a hypothetical, representative current-voltage curve for a memory element.

FIG. 2B includes a set of theoretical IV curves for a set and reset bit. The set bit is relatively low resistance beginning at the origin and sloping up to intercept the snapback of the reset bit, where the dynamic resistance tends to be lower for increasing current. Reducing the current will retrace to the origin if the bit is set. If the bit is reset, as the current is reduced the voltage is reduced until less than $I_H$(oum), where the voltage then increases along the lower curve towards $V_{TH}$(oum) if current is again increased.

In FIG. 1, Transistors 28, 38, and 39 are on/off switches that provide the desired current generated by the current sources 22, 24 or 26, to the selected column 14. A gate 36 with an input from Enable 34 provides a control circuit for the transistor 39 and thus for the read current source 26, and also may provide an enable signal for Din gates 25 and 26 to enable one of the two for writing to the user selected state of Din.

The gates 25 and 26 are gated on by an enable signal from 36 and receive a Din signal 30 as another input to select which write current source is activated. An input/output I/O control 32 is coupled to the Din circuit 30 to define the state to be written in the cell. Enable 34 is controlled by the Write input to the chip. Write input or read fetch 47 requests a read cycle from the chip and starts the on-chip timing block 49.

The timing block 49 starts the on-chip timing that starts address selection and read current, and then sequentially enables the comparator 42 and latches the data for the I/O from a read, or enables Din gates 25 and 26 (and turns off transistor 39) if a write. Enabling current sources 22 or 24 produces a current pulse of appropriate applitude to write a reset with 22 or less amplitude with 24 to write a set state.

Alternately, the current amplitude for both reset and set use the reset current source 22, with the bit written to reset if the trailing edge is fast (less than 10 nsec) or slow (for example, greater than 100 nsec) if set state is desired, a difference in trailing edge rate that may be achieved by appropriately tailoring the turn-off of transistor 28 by adjusting the drive of gate 25.

For reading, a comparator 42 is enabled by the on-chip timing 49 (in response to a Read fetch 47 request), and receives one input from a selected column, for example selected column 14c being read, and another input VREF that determines cell state. The sense amplifier comparator 42 and reference voltage generator 40 may be provided on each column 14 in one embodiment, but, as shown, the generator 40 may be shared across an array or block of row and column lines to reduce sense amp related layout area.

The reference VREF voltage generator 40 receives a voltage VR from the column 14 and outputs a voltage VREF to the comparator 42. The reference generator 40 is strobed by a sample and hold (SH) strobe from the on-chip timing block. The output from the sense amplifier 42 to a data output latch 44 provides an output enable (OE) signal as an option which may indicate when the output can be driven (ready/busy), though OE may be furnished by the processor to enable the output driver onto I/O 32. The output signal from the latch 44 is controlled by a read (R) strobe from the on-chip timing 49.

The set state corresponds to a lower resistance value and the reset state corresponds to a higher resistance value in the phase change memory 12b. Thus, the reference voltage level is between the possible reset and set levels, at the instance of time when read data is latched.

Figure 3:
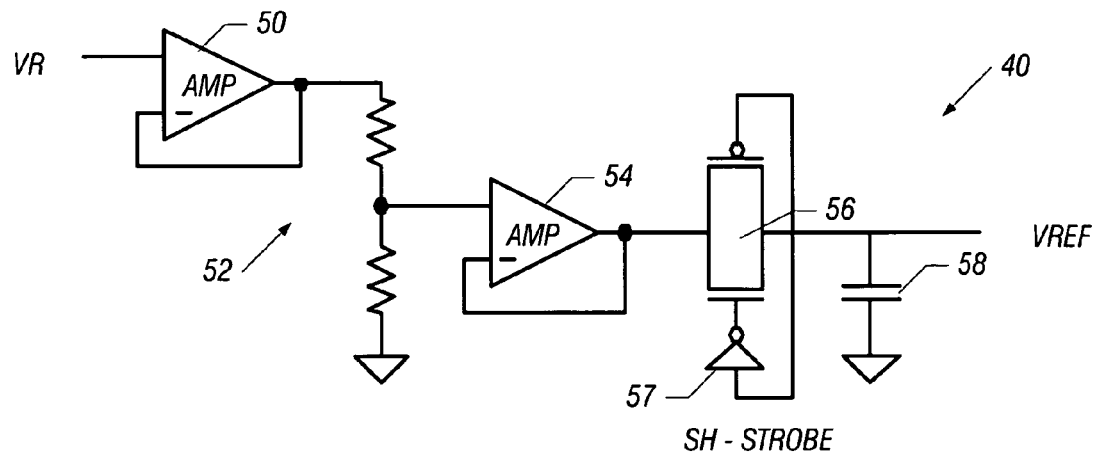
FIG. 3 is a circuit diagram for the voltage reference generator shown in FIG. 1 in accordance with one embodiment of the present invention.

Referring to FIG. 3, the generator 40 receives a reference signal voltage VR from the selected column 14. That voltage is buffered by a first amplifier 50 and a second amplifier 54. Both may be connected to be unity gain. The amplifier 54 receives its voltage level shifted from a voltage divider 52. While a resistor divider is shown, other voltage dividers may be used including a capacitor divider for reduced power and better layout efficiency. The voltage divider 52 may provide a 0.25 volt offset from the actual column voltage in one embodiment.

A pass transistor multiplexer, including transistors 56, is controlled by the sample and hold (SH) strobe signal. The transistors 56 conduct when the sample and hold (SH) signal turns on the transistors. The SH strobe signal determines when to latch the reference voltage level, by turning off the transistors 56 after the appropriate column voltage is sampled. The signal from pass transistors 56 may then be stored for subsequent comparison for a period of time in a capacitor 58. In one embodiment, the capacitor 58 may be 0.001 microfarads, adequate in size to store the reference voltage signal without significant decay for whatever time is necessary to allow the column to subsequently change and be compared to this level. This same function can also be done by a more sophisticated sample and hold, analog to digital conversion with arithmetic adjustment, followed by a digital to analog conversion.

Figure 4A:
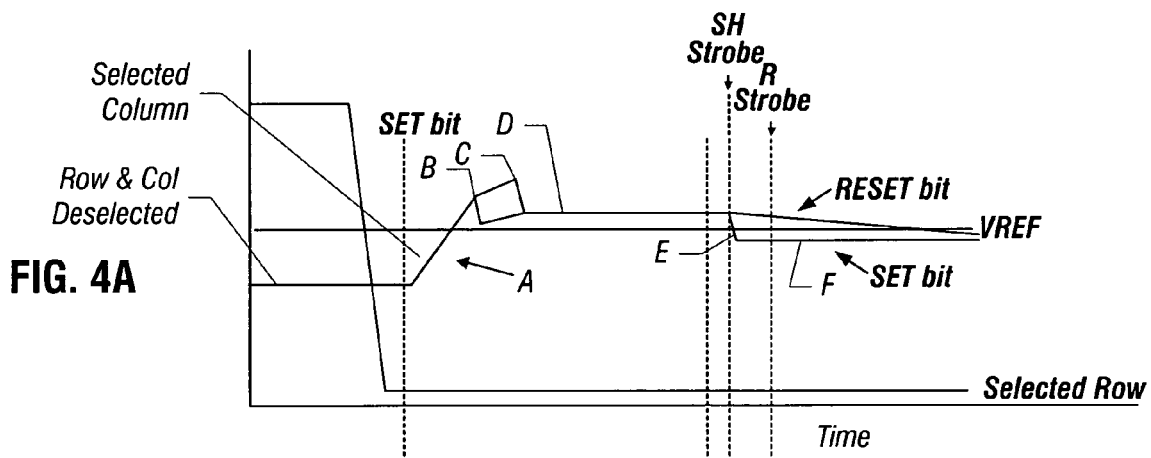
FIG. 4A is a plot of voltage versus time for a selected column in accordance with one embodiment of the present invention.

Referring to FIG. 4A, the column voltage level over time during read is shown for a selected column 14c and row 16c in accordance with one embodiment. In standby or when deselected, the column and row voltages may approximately equal to V/2, where V is related to the threshold voltages of the devices 12a and 12b and V may be adjusted die to die, or block to block by trimming techniques (such as with laser fuses or volatile or non-volatile memory) familiar to those reasonably skilled in the art. For improved voltage margin at the expense of increased deselect leakage, the column deselect may be V/3 and the row deselect 2V/3. For example, V/2 may be 2V with the threshold voltage of the device 12a at 3V with $V_H$ of 2.5V, and the threshold voltage of the device 12b at 1V with a $V_H$ of 0.5V.

While the selected column voltage goes high, the selected row voltage goes low (unless, for example, the select device is an N-channel transistor, where the selected row line goes high for select. The selected row 16 has an initially high voltage, such as V/2, which falls to a steady low voltage as indicated.

Figure 4B:
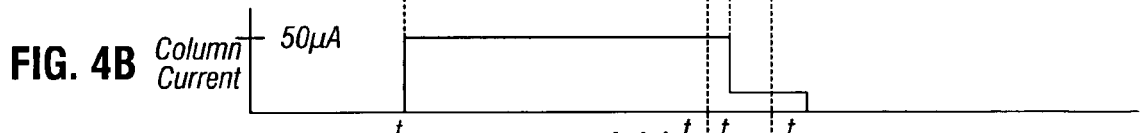
FIG. 4B is the read current forced into the column for the selected column versus time in accordance with one embodiment of the present invention.

The deselected column 14 remains at a relatively low voltage such as V/2. The selected column has a relatively low deselected voltage which increases as the column is selected, as shown in FIG. 4A when the read current is turned on in FIG. 4B. The column read current is indicated in FIG. 4B, where it is shown how the read current into the selected column steps up, which then causes the selected column voltage to increase. The read column current is above the threshold currents of the threshold device 12a and memory element 12b.

The selected column line 14c is first charged from a deselected voltage to a voltage forced by a read current through the bit that starts at time $t_1$ in FIG. 4B. The read current (e.g., 50 micro Amps) may be greater than the threshold current of the memory element 12b, so selected column charging is achieved relatively quickly with this relatively high read current. Better speed may be achieved in some embodiments with even higher currents since the column voltage charging rate is proportional to the current (dV/dT=I/C).

The column voltage first peaks at B when the select device 12a triggers from $V_{TH}$ to $V_H$, and may lower the column if it is in a set state unless Iread×Rset is greater than Vthots–Vhots. If the bit is set, the voltage may drop back to a lower voltage due to the relatively lower resistance of a set bit, towards the $V_H$(ots). If the bit is reset, the voltage may initially decrease modestly if at all, but will then continue to increase from B to C, when the reset memory element 12b thresholds (triggers) to a lower holding voltage. If the difference between $V_{TH}$(ots) and $V_H$(ots) is greater than $V_{TH}$(oum), then both the ots and reset oum may trigger at B, and the notch at C does merges into B.

Using the circuit of FIG. 3, the resulting voltage VR is sampled at time $t_2$ after both the select device 12a and memory element 12b and select device 12a are in the dV/dI region of the memory element 12b (indicated in FIGS. 2A and 2B) and after the column is near Vfinal ($V_H$(ots)+$V_H$(oum)+I read×(Rdyn(ots)+Rdyn(oum)). The column will be at a similar voltage regardless of the memory element 12b bit state (high or low resistance stored in the memory element 12b). By forcing a read current greater than the Ith of each, both the select device 12a and memory 12b are forced into their respective dV/dI regions. Or, if the select device is an MOS transistor or diode, the select device is on and the memory element 12b is triggered on.

Figure 4C:
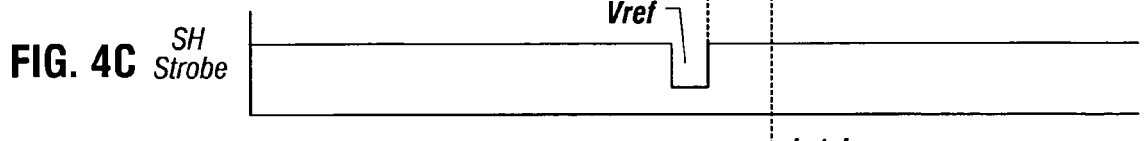
FIG. 4C is a plot of the sample and hold strobe voltage versus time in accordance with one embodiment of the present invention.

After the column reasonably approaches Vfinal, this resulting column voltage is sampled, reduced by an offset voltage (such as 0.25V), and then this voltage is held as a reference voltage by the reference voltage generator 40 for input to the comparator 42. This voltage VREF is held for comparison to a subsequent column voltage after the column has changed in response to a change in read current driving the column. The Vref is held for an adequate period of time, as indicated in FIG. 4A, after it is latched at time t2 from strobe in FIG. 4C.

Figure 4D:
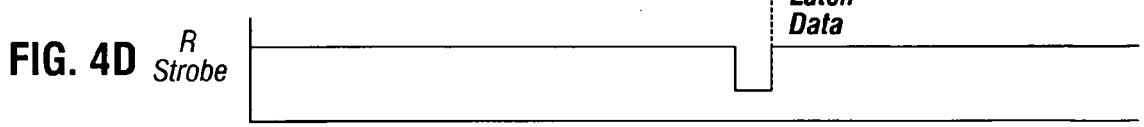
FIG. 4D is a depiction of the R strobe that latches the cell state or read strobe voltage versus time in accordance with one embodiment of the present invention.

After the column voltage is sampled and held, the read current into the column may be reduced at time t3, after the column voltage at t2 is sampled and held. This reduction in read current starts the period of time for comparing the declining column voltage with the stored reference voltage (VREF) from FIG. 3, a voltage indexed down slightly so a reset bit will be above it. Once the current is reduced, the resulting column voltage after a period of time ($t_4$–$t_3$) is compared to the reference voltage by the comparator as a relatively more positive or negative voltage, with the resulting data from the memory latched by strobing the data at t4, as shown in FIG. 4D.

The reference voltage (VR) may be adjusted for varying drops in the row line or ground line (where an MOS transistor or diode is used). Other variations such as for temperature are also possible.

With a read current that is greater than the threshold current ($I_{TH}$ in FIG. 2B) of memory element 12b, the select device 12a may trigger (see point B in FIG. 4A) or be turned on (if an n-channel MOS device) before the element 12b (see point C in FIG. 4A) because the select device threshold current may be less than the memory element's threshold current in some embodiments. If the bit is set (low resistance), the RC time constant on the column after the device 12a triggers is low because the set resistance is low.

If the element 12b is in the high resistance state, the column continues to charge since Vfinal final voltage until 12b triggers is greater than the sum of holding voltage of the device 12a and the threshold voltage of the memory element 12b. The dynamic resistance is still high until memory element 12b triggers, so the final voltage towards which the column charges until the memory element triggers is still very high after the select device 12a triggers (or an NMOS row select device turns on).

Once the bit is accessed after the device 12a triggers, a set bit is in a low resistance state and the column reaches its final voltage (Vfinal) quickly due to its low RC time constant. For a higher resistance reset bit, the column RC is high, but the column continues to rise rapidly since the final voltage (Vfinal) charging voltage is still very high compared to the column voltage because Iread×Rbit is high until the reset bit triggers into a low resistance state. As the voltage across the element 12b exceeds its threshold (if it is reset), the bit triggers into a low dV/dI state at C, and decays to about the same voltage as the voltage from a set bit.

After both memory elements, 12a and 12b have triggered, the bit voltage whether set or reset, is approximately $V_{HA}$+ $V_{HB}$+Iread×dV/dI(device a)+dV/dI (device b), where $V_{HA}$ and $V_{HB}$ are the holding voltages of the device 12a and element 12b, respectively, and dv/di are the dynamic on resistance of devices 12a and 12b respectively. This voltage D, set by dV/dI, read current, and holding voltage, is achieved rapidly since Vfinal is much greater than D until the memory element 12b triggers, and then resistance is low once both the select device 12a and memory element 12b trigger into the dV/dI region.

While the resistance is low in the dV/dI portion of the IV curve for reset memory element 12b after it thresholds, the amorphous bit state may be retained by avoiding use of excess read current or column capacitance that may cause excess snapback current when 12b turns on or 12a thresholds. Data retention during read is shown by the returning to the higher resistance state after the current through memory element 12b is reduced below $I_H$ at time t3, as shown in FIG. 4B. For good margin, the read current through the memory element 12b should be maintained below 50% of Iset min (the current necessary to program a bit to a lower resistance set state, sometimes labeled Imelt or Isafe.

Once triggered, the reset bit stays in a relatively low resistance dV/dI, a resistance like that of a set bit, until the current is returned to less than the holding current. This voltage D achieved after the column line voltage stabilizes in the dV/dI portion of the IV curves of both the cell elements, with both elements thresholded on, is called "precharge voltage" and is used to generate the reference voltage.

After the precharge voltage D is established and stable on the column line, the column line voltage VR can be sampled to establish a relatively lower reference voltage (VREF). The selected column bit voltages VR and VREF are inputs to the comparator 42.

The column current is reduced to a current less than Ihold of the memory material 12b (or turned off) at the time $t_3$ in FIG. 4B. After the read current is turned off at time t3, the column rapidly discharges to the memory element 12b holding voltage since dV/dI is a relatively low resistance for both the set and reset bit. Below $V_H$, the resulting voltage across a set bit continues to decay rapidly (region E in FIG. 4A). Thus after decreasing the read current (here to zero), the column voltage of a set bit decays rapidly from its starting precharge voltage at time t2 to nearly zero across the memory element 12b, ending with the column at a voltage equal to Vrow driver+select element 12a $V_H$.

In contrast, for a reset bit, the column line stops discharging rapidly once the device 12b holding voltage is reached. Then, with less than Ih through 12b, the bit untriggers into a high resistance state. Further voltage decay thereafter is at a very slow rate, such as microseconds (region F in FIG. 4A). Thus, after a set bit stabilizes, a short time thereafter, the bits may be compared to VREF and the data latched.

For both a set bit and reset bit, the initial voltage decay rate (dV/dt) (region E) is set by the resistance of the dV/dI portion of the IV curve of 12b (since its dv/di may be greater than that of 12a) until voltage across memory element 12b is at or less than $V_{H(oum)}$. Then the decay rate (region F) changes to a rate set by the resistance stored in memory element 12b. For voltage across 12b below its holding voltage, the set reistance is then different from the reset bit resistance. Thereafter, the decay rate is much different and the bit state may be determined by comparison to the VREF.

With VREF set between a voltage of $V_{H(ots)}$ and a higher voltage but less than $V_{H(ots+oum)}$, the data may be strobed, as indicated in FIG. 4D, after waiting some portion of the set bit RC time constant, where R is the set bit resistance and C is column capacitance. Preferably, this time should be short enough so the reset bit has not signicantly discharged the column line below the $V_H$(ots)+$V_H$(oum) voltage for that selected bit being read.

In some embodiments, using this approach may reduce the effect of variation in device 12a holding voltage, bit to bit. By first sampling the column voltage before the column current is turned off for final comparison to the resulting sampled voltage after the column current is reduced, the effect of variation in Vhots bit to bit in the array is reduced.

A reference is generated for each bit that is used for comparison to the resulting bit voltages. The column is first sensed (and then reduced) using the $V_{Hots}$ and $V_{Houm}$ of the bit being read, which is then later subtracted from the column voltage when the later comparison is made to the cell after current is reduced, thus improving voltage margin in some embodiments. Further, the precharge voltage may be established rapidly since a current greater than the OUM threshold current is used to create the sampled voltage. The effect of imprecision in this initial read current forced may be reduced or minimized with a lower dynamic resistance in this region of the IV curve for both the device 12a and element 12b.

Figure 5:
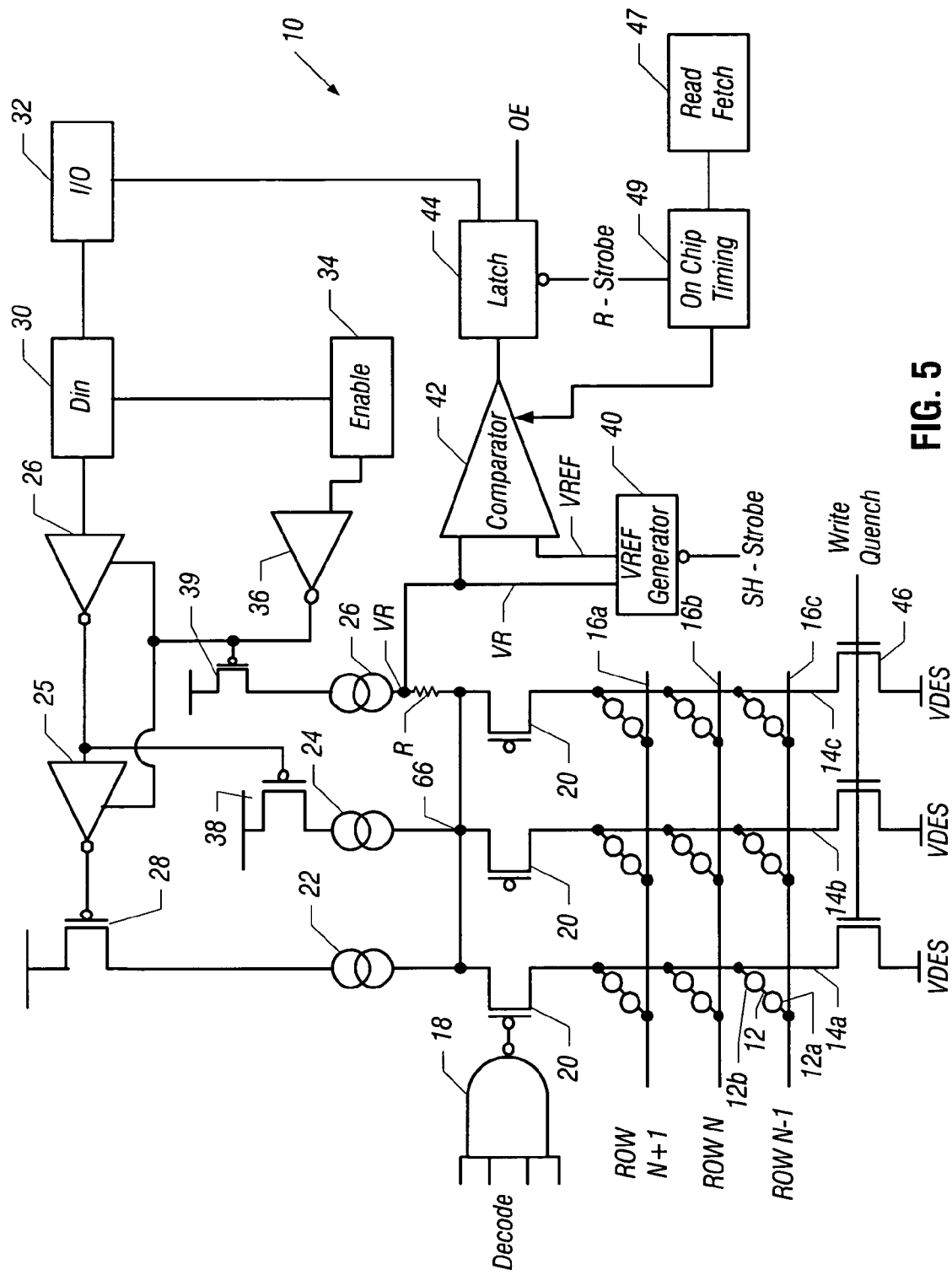
FIG. 5 is a circuit diagram for another embodiment of the present invention.

To further improve margin, another embodiment in FIG. 5 shows a memory 10a similar to the memory 10, but wherein the read current mirror has an extra resistance R in series, that may be placed above the select devices 20 as shown in FIG. 5 to minimize area, or placed on each column. The resulting voltage VR on the column where the discharge slows for a reset bit is at a higher voltage (by Ih×R) relative to that achieved rapidly by a set bit, so that the read window and margin is amplified in some embodiments like that shown in FIG. 5.

The voltage across the optional resistor R may provide added read margin which can be adjusted with the size of the resistor to fit the threshold current for a given chip, using the non-volatile portion of the memory or the fuse redundancy repair circuit to adjust R along with the VREF, to improve margins. The magnitude of the resistance R, as is apparent to one reasonably skilled in the art, is limited to that allowed by performance requirements to the delay increase in the RC discharge time for a set bit. More voltage margin is provided at increased R but at the expense of increased read access delay because the RsetC for a set bit is increased to be (Rset+R)C.

The memory element 12b may reasonably retain its memory cell state for a useful number of cycles, even though the current drives the reset bit into the low resistance dV/dI state. However, repeated reads that threshold (trigger) the reset bit may reduce the untriggered reset bit resistance, until the bit appears set when read (read disturb). As this untriggered reset resistance decreases, the memory element 12b threshold voltage may also decrease.

Once the resistance degrades too much for adequate read voltage margin, the reset bit must be re-written (refreshed) to avoid a read disturb. Refresh is accomplished by reading bit, and those in the reset (high resistance) state can be rewritten after each read cycle. Alternately, the read margin may be measured by indexing up the VREF or generating an addition VREF that is higher than the VREF used for cell state margin decision. Then, for a bit read as reset, the level relative a a higher VREF can also be checked. If the cell reads as reset but does not have enough margin to also be above the higher VREF, the bit can then be refreshed by rewriting to reset state.

Limiting the current and use of low capacitance loads by reducing the number of bits on a column may assist data retention, and can reduce how often the bit is rewritten, thus extending endurance and overhead time spent rewriting during read. Also, cycling the bit, including with a few read cycles after each write, may remove the threshold related snapback of the oum 12b. If this is done 15 cycles during the write cycle and the bit verified, better data retention can be achieved. Further, the bits can be read on power down or power up to restore those degraded by read cycles.

Alternatively, the entire block of memory can be refreshed periodically, such as every second or by counting the total read cycles in the block, on the assumption that worst case all reads could be to the same single bit. Alternately, since the write of a reset bit is relatively fast, each time a bit is read and found to be reset, the bit may be rewritten during the end of a read cycle—retaining the good read access delay but possibly increasing read cycle time for the write reset cycle. Repeatedly rewriting a reset bit will adversely affect endurance so normal block reallocation techniques used for flash may be applied to extend product perceived endurance. An example timing diagram is shown in 6 where the read cycle is executed as described in FIG. 4. In parallel or thereafter, the column may also be compared to a reference at a higher level during the period labeled "measure margin." Thereafter, if the margin is inadequate, the rewrite may then be executed (and a read cycle repeated to confirm margin, if further certainty is desired).

Using the techniques described herein, in some embodiments, margins may be improved by avoiding the reduction in read window margin due to variation in device 12a hold voltage. This may improve yield and field reliability in some embodiments.

A voltage reflective of cell select and memory hold voltages is first generated for sample/hold with the column read current to create a reference voltage, and then the read current is turned off or reduced for comparison of the column to the sampled reference voltage to improve margins by subtracting the hold voltages which may vary bit to bit, so the resulting voltage comparison relates more to the memory resistance instead of the hold voltages, and is therefore more reflective of cell state. In some embodiments, by using the dV/dI region D in FIG. 4A to set the reference voltage, holding voltage variation effects on read margins may be reduced and read performance improved by setting a reference while the memory is in a low impedance mode.

Figure 7:
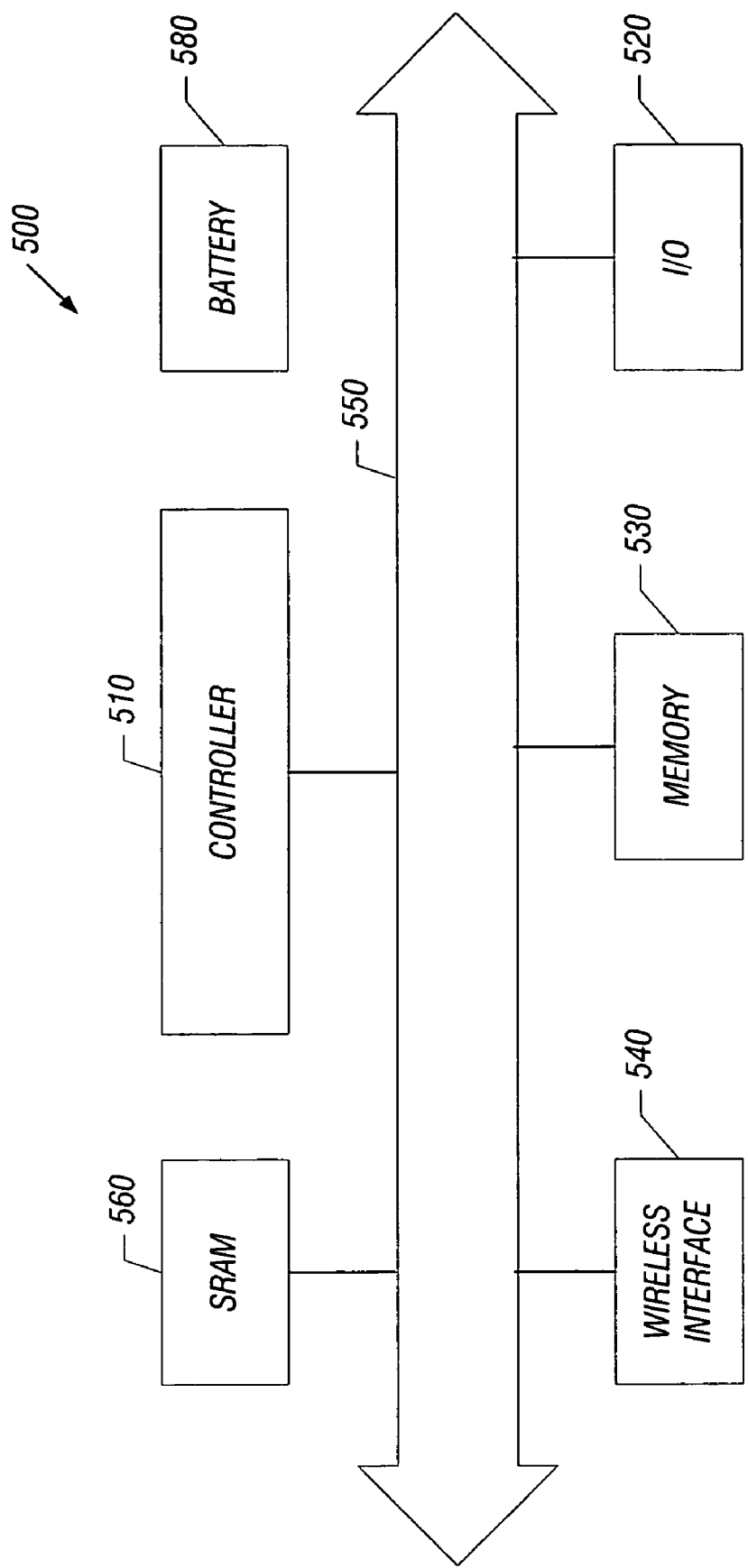
FIG. 7 is a system depiction according to one embodiment of the present invention.

Turning to FIG. 7, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or memory 10 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
reading a cell, including a phase change memory element, on a memory line by triggering said phase change memory element.

2. The method of claim 1 including providing a reference level sampled and held from said memory line.

3. The method of claim 2 including comparing said reference level to a level on said line after a time delay.

4. The method of claim 3 using a reference level derived from the voltage on the memory line.

5. The method of claim 2 including obtaining said reference level when said cell is in a dV/dI region.

6. The method of claim 5 including storing said reference level from the line for comparison to a second level on said line at a later time.

7. The method of claim 6 including comparing said reference and second levels after turning off the current to said memory line.

8. The method of claim 1 wherein reading a cell on a line includes driving a line current greater than the threshold current of said cell.

9. The method of claim 8 including using a cell with a phase change memory element and a threshold device and driving a column current greater than the threshold current of said element.

10. The method of claim 9 including using a cell with a chalcogenide threshold device that is not programmable.

11. The method of claim 1 including refreshing said cell after reading said cell in said array.

12. A memory comprising:
an array of cells including phase change memory elements; and
a sense amplifier to sense a characteristic of a triggered phase change memory element of a cell in said array.

13. The memory of claim 12 said array including a memory line and said memory including a sample and hold reference generator coupled to a memory line.

14. The memory of claim 13 wherein said reference generator to offset the level of a signal from said sample and hold reference generator.

15. The memory of claim 14 wherein said reference generator to store a reference level from said line.

16. The memory of claim 15 wherein said generator to hold and output the reference level for comparison after a time delay.

17. The memory of claim 13 wherein said sense amplifier to sense whether a level is above or below a reference level.

18. The memory of claim 13 wherein said sense amplifier to compare a level on a line at two different times.

19. The memory of claim 18 wherein said sense amplifier to compare levels from before and after changing the read current.

20. The memory of claim 14 wherein said sense amplifier to compare a reference voltage, generated before a read current is reduced, to a voltage generated after the read current is reduced, and a rewrite is executed after reading the cell.

21. The memory of claim 12 wherein said cell includes a phase change memory element and a select device.

22. The memory of claim 21 wherein said select device includes a nonprogrammable chalcogenide.

23. A system comprising:
a processor; and
a memory including an array of phase change memory cells including phase change memory elements and a sense amplifier to sense a triggered phase change memory element.

24. A system of claim 23 wherein said cells include a nonprogrammable chalcogenide threshold device.

25. The system of claim 23 wherein said memory includes address lines coupled to said cells and a reference generator coupled to an address line including a cell to be sensed.

26. The system of claim 25 wherein said reference generator to store a reference level offset from said line for comparison to said line at a later time.

* * * * *